United States Patent
Toh et al.

(10) Patent No.: US 12,349,444 B1
(45) Date of Patent: Jul. 1, 2025

(54) UNDER-SOURCE BODY CONTACT

(71) Applicant: GlobalFoundries Singapore Pte. Ltd., Singapore (SG)

(72) Inventors: Rui Tze Toh, Singapore (SG); Fangyue Liu, Singapore (SG); Mark David Jaffe, Shelburne, VT (US)

(73) Assignee: GLOBALFOUNDRIES Singapore Pte. Ltd, Singapore (SG)

( * ) Notice: Subject to any disclaimer, the term of this patent is extended or adjusted under 35 U.S.C. 154(b) by 0 days.

(21) Appl. No.: 18/632,960

(22) Filed: Apr. 11, 2024

(51) Int. Cl.
| | |
|---|---|
| H10D 64/66 | (2025.01) |
| H10D 30/01 | (2025.01) |
| H10D 30/65 | (2025.01) |
| H10D 30/67 | (2025.01) |
| H01L 21/02 | (2006.01) |

(52) U.S. Cl.
CPC ....... *H10D 64/668* (2025.01); *H10D 30/0281* (2025.01); *H10D 30/65* (2025.01); *H10D 30/6711* (2025.01)

(58) Field of Classification Search
CPC ........... H01L 29/66681; H01L 29/7816; H01L 29/4975; H01L 29/66659; H01L 29/7835; H01L 29/1095; H01L 29/78615; H01L 29/7841
See application file for complete search history.

(56) References Cited

U.S. PATENT DOCUMENTS

| | | | | |
|---|---|---|---|---|
| 8,558,308 | B1* | 10/2013 | Blank | H10D 12/481 438/270 |
| 9,515,178 | B1* | 12/2016 | Qin | H10D 30/0297 |
| 9,741,845 | B2* | 8/2017 | Disney | H10D 64/111 |
| 9,887,288 | B2* | 2/2018 | Edwards | H01L 21/324 |
| 9,899,514 | B2* | 2/2018 | Toh | H10D 30/6708 |
| 10,020,394 | B2* | 7/2018 | Toh | H10D 30/0285 |
| 10,032,905 | B1* | 7/2018 | Zhang | H10D 30/0221 |
| 10,453,958 | B2* | 10/2019 | Mori | H10D 62/127 |
| 10,985,183 | B2* | 4/2021 | Willard | H10D 30/6711 |
| 11,257,949 | B2* | 2/2022 | Mun | H10D 30/658 |
| 2003/0067026 | A1* | 4/2003 | Bulucea | H10D 12/211 257/303 |
| 2004/0217418 | A1* | 11/2004 | Imam | H10D 62/127 257/341 |
| 2009/0108346 | A1* | 4/2009 | Cai | H10D 30/65 438/236 |
| 2009/0215235 | A1* | 8/2009 | Knaipp | H10D 84/0167 438/232 |
| 2013/0207187 | A1* | 8/2013 | Huo | H01L 21/76283 257/E29.256 |
| 2013/0292763 | A1* | 11/2013 | Chang | H10D 30/603 257/335 |

(Continued)

*Primary Examiner* — Maliheh Malek
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to under-body source contact structures and methods of manufacture. The structure includes: a gate structure on a semiconductor layer; a drift region within the semiconductor layer, below the gate structure; a body region within the semiconductor layer, below the gate structure; a contact region within the body region, the contact region being devoid of a silicide contact; and a silicide contact remote from the contact region within the semiconductor layer.

15 Claims, 3 Drawing Sheets

(56) References Cited

U.S. PATENT DOCUMENTS

| | | | |
|---|---|---|---|
| 2014/0252472 A1* | 9/2014 | Chen | H10D 30/0281 438/286 |
| 2015/0325693 A1* | 11/2015 | Mori | H10D 64/118 257/339 |
| 2016/0111488 A1* | 4/2016 | Lu | H10D 64/117 438/270 |
| 2016/0155841 A1* | 6/2016 | Huo | H10D 12/01 257/339 |
| 2016/0343853 A1* | 11/2016 | Toh | H10D 30/0285 |
| 2017/0077296 A1* | 3/2017 | Yang | H10D 62/116 |
| 2018/0151726 A1* | 5/2018 | Toh | H10D 30/0285 |
| 2018/0226502 A1* | 8/2018 | Kawahara | H10D 62/157 |
| 2018/0269279 A1* | 9/2018 | Birner | H01L 21/26513 |
| 2018/0286853 A1* | 10/2018 | Mallikarjunaswamy | H10D 89/711 |
| 2019/0067476 A1* | 2/2019 | Mori | H10D 30/603 |
| 2019/0172946 A1* | 6/2019 | Wu | H10D 30/65 |
| 2019/0259875 A1* | 8/2019 | Li | H10D 62/393 |
| 2020/0013880 A1* | 1/2020 | Ho | H01L 23/60 |
| 2020/0044022 A1* | 2/2020 | Huang | H10D 62/115 |
| 2020/0058787 A1* | 2/2020 | Nguyen | H10D 30/0281 |
| 2021/0074851 A1* | 3/2021 | Chiu | H10D 30/0281 |
| 2021/0359132 A1* | 11/2021 | Mun | H10D 30/658 |
| 2022/0115534 A1* | 4/2022 | Chen | H10D 30/0281 |
| 2022/0181444 A1* | 6/2022 | Toner | H10D 62/378 |
| 2023/0028453 A1* | 1/2023 | Lin | H10D 64/01 |
| 2023/0046174 A1* | 2/2023 | Lo | H10D 30/65 |
| 2023/0146397 A1* | 5/2023 | Mori | H10D 64/519 257/343 |
| 2023/0187546 A1* | 6/2023 | Yedinak | H10D 30/668 |
| 2023/0246081 A1* | 8/2023 | Lin | H10D 64/01 257/339 |
| 2023/0253494 A1* | 8/2023 | Lo | H10D 62/116 257/339 |
| 2023/0420560 A1* | 12/2023 | Ho | H10D 30/65 |
| 2024/0097008 A1* | 3/2024 | Tamura | H10D 30/657 |
| 2024/0105838 A1* | 3/2024 | Lee | H10D 30/655 |
| 2024/0178317 A1* | 5/2024 | Mori | H10D 30/603 |
| 2024/0243175 A1* | 7/2024 | Vanukuru | H10D 62/378 |
| 2024/0258377 A1* | 8/2024 | Saggio | H10D 30/66 |

* cited by examiner

UNDER-SOURCE BODY CONTACT

BACKGROUND

The present disclosure relates to semiconductor structures and, more particularly, to under-body source contact structures and methods of manufacture.

A transistor is a semiconductor device used to amplify or switch electrical signals and power. A "weak" transistor refers to a transistor that is not functioning at its full capacity or is not able to carry its designed current or voltage. A weak transistor may not perform as expected in electronic circuits and can lead to issues such as signal degradation or circuit malfunction.

A "weak" transistor can be due to many different factors such as manufacturing defects or damage. For example, a weak transistor may result from the source body contact, e.g., N-source implant, being consumed by silicide, leading to weak source contact, particularly in silicon-on-insulator (SOI) technologies.

SUMMARY

In an aspect of the disclosure, a structure comprises: a gate structure on a semiconductor layer; a drift region within the semiconductor layer, below the gate structure; a body region within the semiconductor layer, below the gate structure; a contact region within the body region, the contact region being devoid of a silicide contact; and a silicide contact remote from the contact region within the semiconductor layer.

In an aspect of the disclosure, a structure comprises: a gate structure; a drift region below the gate structure; a body region below the gate structure; a source-side body contact within the body region; a silicide block over the source side body contact; contact regions adjacent to the source-side body contact; and a silicide contact on the contact regions remote from the source-side body contact within the body region.

In an aspect of the disclosure, a method comprises: forming a gate structure on a semiconductor layer; forming a drift region within the semiconductor layer, below the gate structure; forming a body region within the semiconductor layer, below the gate structure; forming a body contact within the body region, the body contact region being devoid of silicide; and forming a silicide contact remote from the body contact within the semiconductor layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to under-body source contact structures and methods of manufacture. More specifically, in embodiments, the under-body source contact structures may be provided on semiconductor-on-insulator technologies comprising a thin layer of semiconductor material (e.g., silicon). Advantageously, the under-body source contact structures comprise a source implant, e.g., N-type source implant, which is not consumed by silicide, leading to improved source contacts. In addition, the under-body source contact structures contribute to a sufficiently thick P-type body-contact formation.

In more specific embodiments, the structure comprises a modified under-source body contact with a self-aligned block (SAB) extension and stripped-butted source contacts above a buried insulator layer, e.g., buried oxide (BOX). The use of a source SAB extension prevents silicide consumption of the source implant, allowing the formation of an under-source body contact. The SAB extension may extend onto a gate structure and, more specifically, over sidewall spacers and a portion of a gate body of the gate structure.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
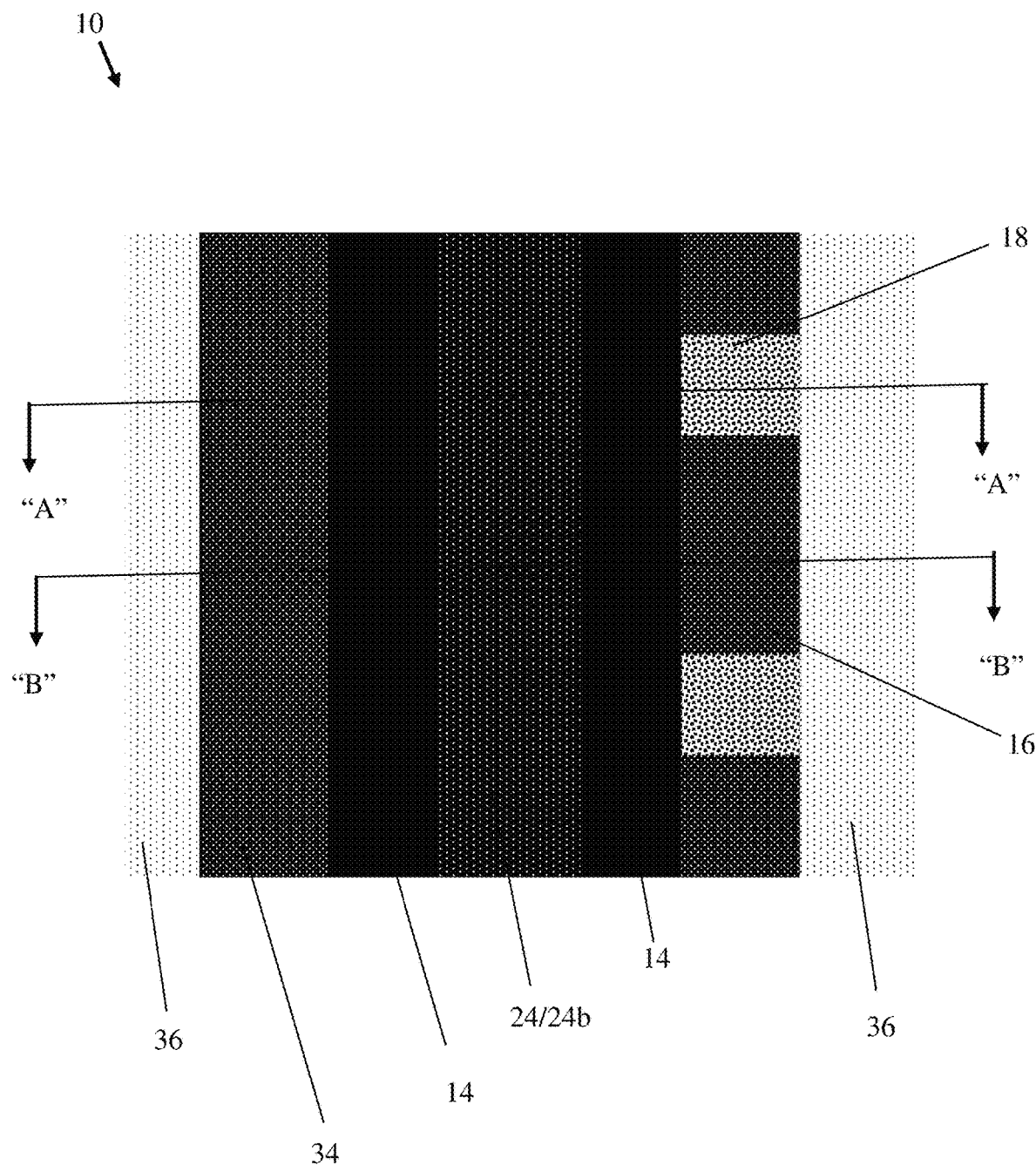
FIG. 1 shows a top view of the structure and respective fabrication processes in accordance with aspects of the present disclosure.
Figure 2:
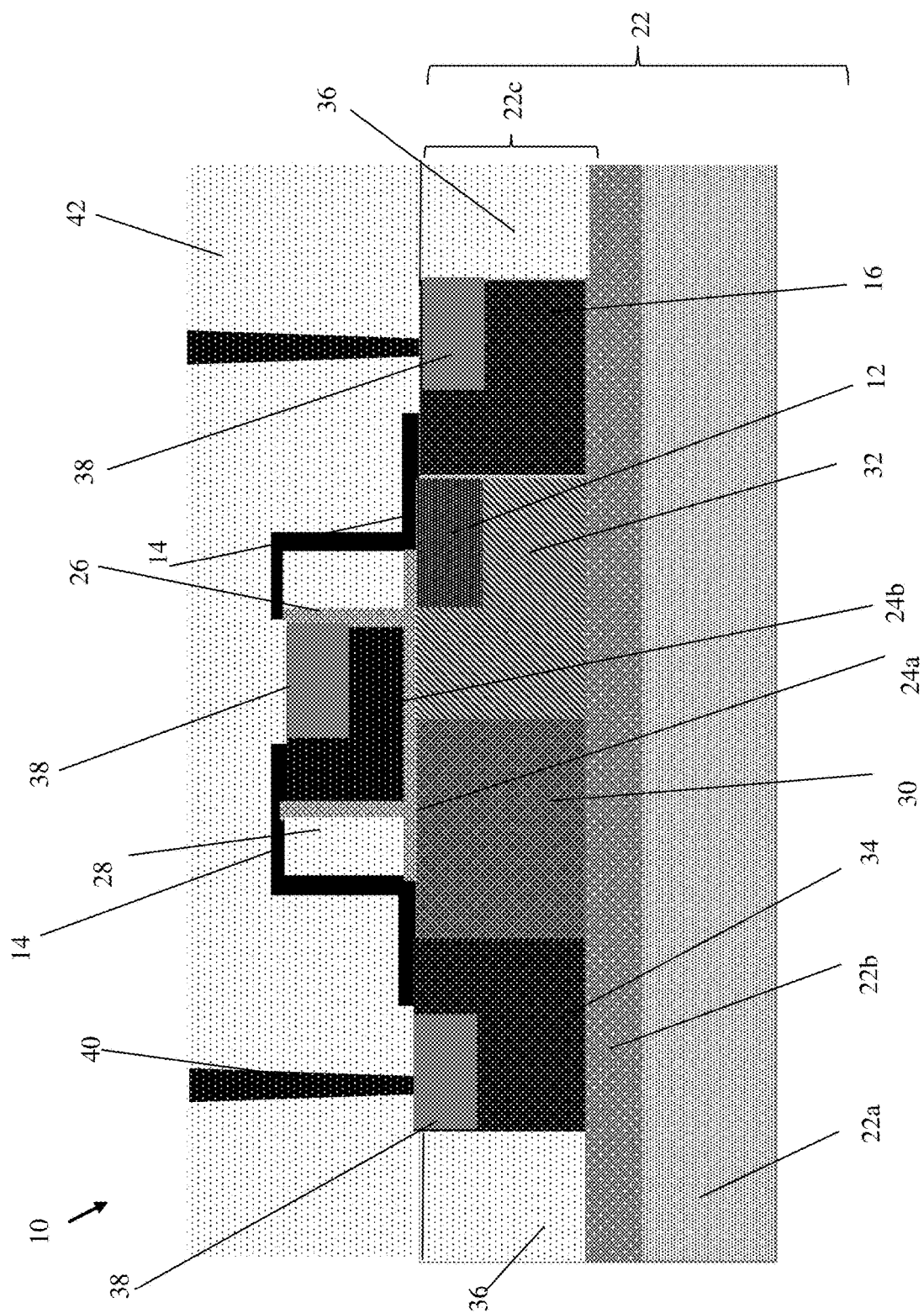
FIG. 2 shows a cross-sectional view of the structure of FIG. 1 along line A-A.
Figure 3:
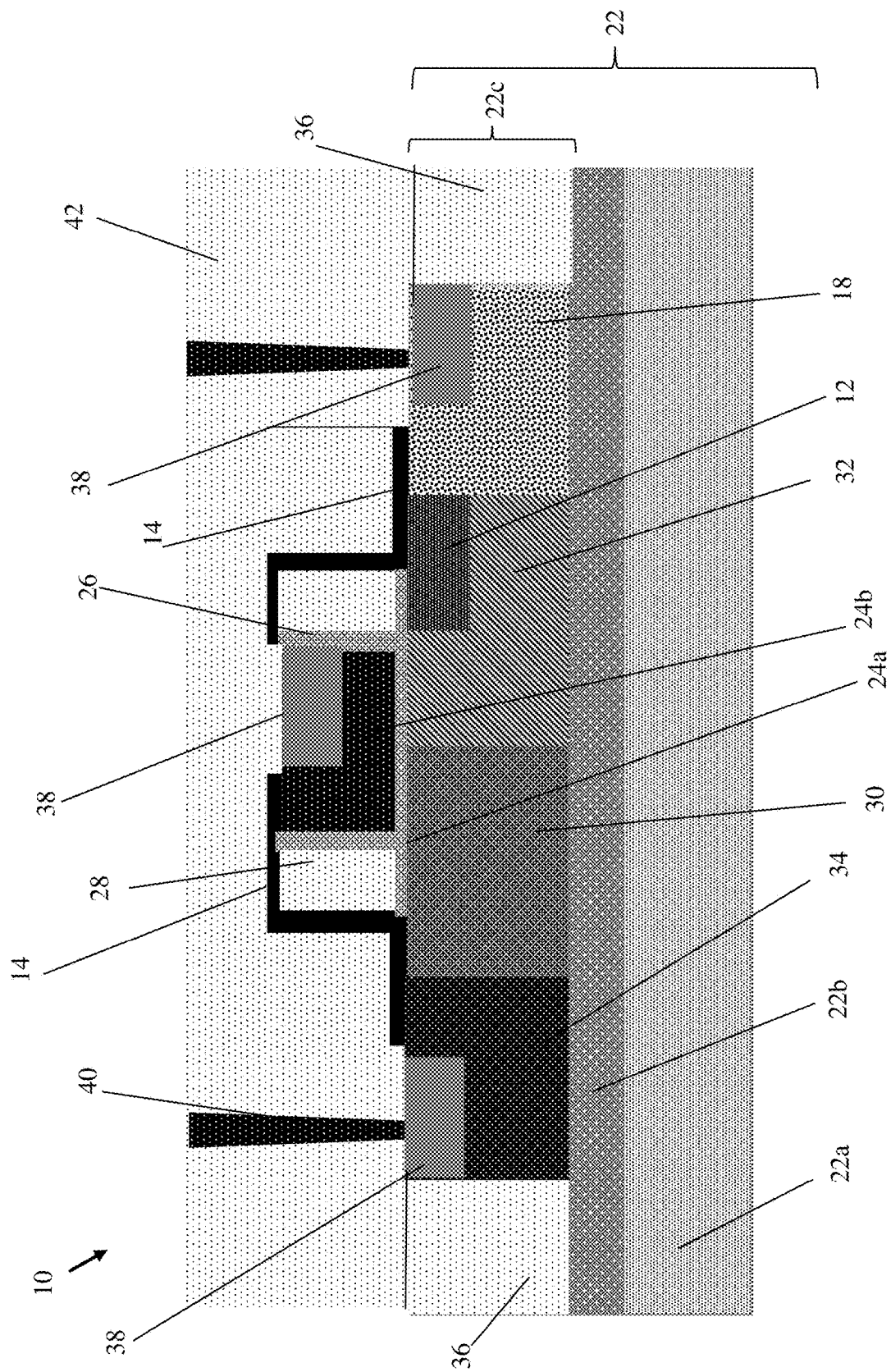
FIG. 3 shows a cross-sectional view of the structure of FIG. 1 along line B-B.

FIG. 1 shows a top view of the structure and respective fabrication processes in accordance with aspects of the present disclosure. FIG. 2 shows a cross-sectional view of the structure of FIG. 1 along line A-A; whereas FIG. 3 shows a cross-sectional view of the structure of FIG. 1 along line B-B. As shown in these views, for example, the structure 10 includes a source-side body contact 12 covered by a silicide block (e.g., SAB) 14. In embodiments, the silicide block 14 covering the source-side body contact 12 prevents silicide formation and, hence, consumption of the source-side body contact 12. The source-side body contact 12 may be an N-type body region.

Contact regions 16, 18 (e.g., N+ type and P+ type contact regions) may laterally connect to (e.g., directly contacting and electrically connecting) the source-side body contact 12. The contact regions 16, 18 may include a silicide contact 20. As shown, the contact regions 16, 18 are not fully consumed by the silicide contacts 20. In embodiments, portions of the contact regions 16, 18 do not include the silicide block 14, e.g., stripped-butted source contact region, thereby allowing the formation of the silicide contact thereon.

More specifically, and referring to FIGS. 2 and 3, the structure 10 includes a substrate 22. In embodiments, the substrate 22 may comprise semiconductor-on-insulator technology. The semiconductor-on-insulator technology may include, from bottom to top, a handle substrate 22a, a buried insulator layer 22b and a top semiconductor layer 22c. The handle substrate 22a and the top semiconductor layer 22c may include a semiconductor material such as, for example, Si, Ge, SiGe, SiC, SiGeC, a III-V compound semiconductor, a II-VI compound semiconductor or any combinations thereof. In preferred embodiments, the handle substrate 22a and the top semiconductor layer 22c may be provided with any suitable single crystallographic orientation (e.g., a <100>, <110>, <111>, or <001> crystallographic orientation). The top semiconductor layer 22c can be formed by a deposition process, e.g., chemical vapor deposition (CVD), plasma enhanced chemical vapor deposition CVD (PECVD), or a smart cut process as is known in the art. The top semiconductor layer 22c may be a thin layer of semiconductor material, e.g., approximately 700 Å, to form the under-source body contact 12 without the implanted region, e.g., under-source body contact 12 and body contact 32 being fully consumed by silicide.

The buried insulator layer 22b may include a dielectric material such as silicon dioxide, silicon nitride, silicon oxynitride, boron nitride or a combination thereof. An exemplary insulator layer may be a buried oxide layer (BOX). In embodiments, the buried insulator layer 22b may be formed by a deposition process, e.g., CVD, PECVD or physical vapor deposition (PVD) as examples.

Referring to FIGS. 1-3, the structure 10 further comprises a gate structure 24. The gate structure 24 may be provided over the semiconductor layer 22c. As shown more clearly in FIGS. 2 and 3, the gate structure 24 may include a gate dielectric material 24a and a gate body 24b (e.g., electrode). In embodiments, the gate dielectric material 24a may be a low-k dielectric material or a high-k dielectric material. For example, the gate dielectric material 24a can be $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate body 24b may be polysilicon material. Sidewall spacers 26, 28 may be provided on the sidewalls of the gate body 24b. The sidewall spacers 26, 28 may be oxide or nitride or combinations thereof.

Although not critical to the understanding of the present disclosure, the gate structure 24 can be fabricated using conventional CMOS processes. For example, in the standard CMOS processing, the gate dielectric material 24a and polysilicon 24b are formed, e.g., deposited, onto the top semiconductor layer 22c, followed a patterning process. An insulator material such as nitride and/or oxide can be deposited on the patterned materials, followed by an anisotropic etching process to form the sidewall spacers 26, 28.

Referring to FIGS. 2 and 3, a drift region 30 and body region 32 may be provided under the gate structure 24 within the substrate 22 and, more particularly, within the top semiconductor layer 22c. The drift region 30 may comprise an N-type implant and the body region 32 may comprise a P-type implant. The source-side body contact 12 may be provided in the body region 32, preferably underneath the sidewall spacers 26, 28. In embodiments, the source-side body contact 12 may extend partially underneath the gate body 24b of the gate structure 24. In embodiments, the source-side body contact 12 may be an N-type body region which may abut the contact regions 16, 18.

The contact regions 16, 18 are abutting one another in an interleaved or interdigitated configuration (alternating being contact region 16 and contact region 18) as shown in FIG. 1. Moreover, the contact regions 16, 18 extend through the entire thickness of the top semiconductor layer 22c, extending to the underlying insulator layer 22b. Also, the silicide contacts 20 do not fully consume the contact regions 16, 18 due to its thickness.

Still referring to FIGS. 1-3, the silicide block 14 completely covers the source-side body contact 12, thereby preventing silicidation on the source-side body contact 12. The silicide block 14 may also cover portions of the gate structure 24, e.g., a portion of the gate body 24b and sidewall spacers 26, 28, in addition to portions of the drift region 30. In further embodiments, the silicide block 14 may partially cover a contact region 34, e.g., N+ type contact region, on a drain side of the structure. In addition, the silicide block 14 may partially cover the contact regions 16, 18, e.g., N+ type contact region and P+ type contact, on a source side of the structure. In embodiments, the silicide block 14 may be a nitride material or other hardmask material.

Further, as shown in FIGS. 1 and 2, the silicide block 14 may partially cover the contact region 16, e.g., N+ type implant region on a source side of the structure. And, as shown in FIGS. 1 and 3, the silicide block 14 may partially cover the contact region 18, e.g., P+ type implant region, on a source side of the structure. In this way, the silicide block 14 will not prevent silicide formation over the uncovered portions of the contact regions 16, 18. The silicide formation will also be remote from the source-side body contact 12, e.g., not abutting or on the source-side body contact 12.

The regions 12, 16, 18, 30, 32 and 34 may be formed by ion implantation processes as is known in the art. For example, the regions 12, 16, 18, 30, 32 and 34 may be formed by introducing different concentrations of different dopant types, e.g., of opposite conductivity type, in the top semiconductor layer 22c. An annealing process may be performed to drive in the dopants into the top semiconductor layer 22c.

In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

The body region 32 and the contact region 18 may be doped with p-type dopants, e.g., Boron (B). In embodiments, the contact region 18 may be doped with a higher concentration of dopant than the body region 32, e.g., P+ body contact 18 and P– body region 32. The source-side body contact 12, the drift region 30, and the contact regions 16, 34 may be doped with n-type dopants, e.g., Arsenic (As), Phosphorus (P) and Antimony (Sb), among other suitable examples. In embodiments, the contact regions 16, 34 may be doped with a higher concentration of dopant than the source-side body contact 12 and the drift region 30, e.g., N+ body contacts 16, 34 and N– source-side body contact 12 and N– drift region 30.

The device is bounded by shallow trench isolation structures 36. In particular, the shallow trench isolation structures 36 abut (e.g., directly contacting) the contact regions 16, 18, 34. The shallow trench isolation structures 36 can be formed by conventional CMOS processes, e.g., lithography, etching and deposition methods known to those of skill in the art.

For example, a resist formed over the top semiconductor layer 22c is exposed to energy (light) and developed utilizing a conventional resist developer to form a pattern (opening). An etching process with a selective chemistry, e.g., reactive ion etching (RIE), will be used to transfer the pattern from the patterned photoresist layer to the top semiconductor layer 22c to form one or more trenches in the top semiconductor layer 22c through the openings of the resist. Following the resist removal by a conventional oxygen ashing process or other known stripants, insulator material (e.g., SiO$_2$) can be deposited by any conventional deposition processes, e.g., CVD processes. Any residual material on the surface of the top semiconductor layer 22c can be removed by conventional chemical mechanical polishing (CMP) processes.

Silicide contacts 38 may be formed on the contact regions 16, 18, 34 and the gate body 24b of the gate structure 24. In embodiments, the silicide contacts 38 will not consume the source-side body contact 12 due to the use of the silicide block 14. As should be understood by those of skill in the art, the silicide process begins with deposition of a thin transition metal layer, e.g., nickel, cobalt or titanium, over the contact regions 16, 18, 34 and the gate body 24b. After deposition of the material, the structure is heated allowing the transition metal to react with exposed silicon (or other semiconductor material as described herein) in the contact regions 16, 18, 34 and the gate body 24b forming a low-resistance transition metal silicide. Following the reaction, any remaining transition metal is removed by chemical etching, leaving silicide contacts 38.

Contacts 40 (e.g., via interconnects and wiring structures) may contact the silicide contacts 38. In embodiments, the contacts 40 may be formed in interlevel dielectric material 42. The interlevel dielectric material 42 may be formed by a conventional deposition process, e.g., CVD, and the contacts 40 may be formed through the interlevel dielectric material 42 using conventional CMOS technologies as already described herein and as is known in the art such that no further explanation is required for a complete understanding of the present disclosure.

The structure can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a gate structure on a semiconductor layer;
   a drift region within the semiconductor layer, below the gate structure;
   a body region within the semiconductor layer, below the gate structure;
   a body contact within the body region, the body contact region being devoid of silicide;
   interleaved contact regions abutting the body contact; and
   a silicide contact remote from the body contact within the semiconductor layer,
   wherein the drift region comprises an N-drift region, the body region comprises a P-body region and the body contact comprises an N-type region and the body contact is a source side body contact.

2. The structure of claim 1, wherein the semiconductor layer is a top semiconductor layer of a semiconductor-on-insulator substrate.

3. The structure of claim 1, wherein the contact regions comprise alternating N-type regions and P-type regions abutting the body region and the body contact.

4. The structure of claim 3, wherein the contact regions comprise the silicide contact.

5. The structure of claim 4, further comprising a silicide block on the body contact.

6. The structure of claim 5, wherein the silicide block partially covers the contact regions adjacent to the body contact.

7. The structure of claim 4, wherein the contact regions extend fully through the semiconductor layer.

8. A structure comprising:
   a gate structure;
   a drift region below the gate structure;
   a body region below the gate structure;
   a source-side body contact within the body region;
   a silicide block over the source side body contact;
   contact regions adjacent to the source-side body contact; and
   a silicide contact on the contact regions remote from the source-side body contact within the body region,
   wherein the drift region comprises an N-drift region, the body region comprises a P-body region, the source-side body contact comprises an N-type region and the contact regions comprise P+ and N+ regions.

9. The structure of claim 8, wherein the drift region, the body region, the source-side body contact and the contact regions are different dopant regions with a semiconductor layer below the gate structure.

10. The structure of claim 9, wherein the semiconductor layer comprises a top semiconductor layer of a semiconductor-on-insulator substrate.

11. The structure of claim 8, wherein the P+ and N+ regions are alternating regions.

12. The structure of claim 8, wherein the contact regions abut the body region and the source-side body contact.

13. The structure of claim 8, wherein the silicide block extends onto the contact regions, adjacent to the source-side body contact.

14. The structure of claim 8, wherein the silicide block extends onto the gate structure.

15. A method comprising:
   forming a gate structure on a semiconductor layer;

forming a drift region within the semiconductor layer, below the gate structure;
forming a body region within the semiconductor layer, below the gate structure;
forming a body contact within the body region, the body contact region being devoid of silicide;
forming interleaved contact regions abutting the body contact; and
a silicide contact remote from the body contact within the semiconductor layer,
forming a silicide contact remote from the body contact within the semiconductor layer,
wherein the drift region comprises an N-drift region, the body region comprises a P-body region and the body contact comprises an N-type region and the body contact is a source side body contact.

\* \* \* \* \*